United States Patent [19]

Hatta

[11] Patent Number: 4,816,873
[45] Date of Patent: Mar. 28, 1989

[54] IMAGING DEVICE

[75] Inventor: Naoyuki Hatta, Gamagori, Japan

[73] Assignee: Brother Kogyo Kabushiki Kaisha, Japan

[21] Appl. No.: 113,536

[22] Filed: Oct. 26, 1987

[30] Foreign Application Priority Data

Oct. 27, 1986 [JP] Japan .................. 61-164829[U]

[51] Int. Cl.[4] .................... G03B 27/32; G03C 1/72
[52] U.S. Cl. .......................................... 355/27; 430/138
[58] Field of Search ............... 355/27, 28, 1, 113; 430/138

[56] References Cited

U.S. PATENT DOCUMENTS

| 3,788,737 | 1/1974 | Kidd | 355/113 X |
| 4,334,762 | 6/1982 | Landa | 355/8 |
| 4,551,407 | 11/1985 | Sanders | 430/138 |
| 4,624,560 | 11/1986 | Beery | 355/27 |
| 4,660,964 | 4/1987 | Yoshikawa et al. | 355/28 |
| 4,715,682 | 12/1987 | Koek et al. | 355/1 X |

FOREIGN PATENT DOCUMENTS

| 1239774 | 7/1971 | United Kingdom . |
| 1385367 | 2/1975 | United Kingdom . |
| 2041561 | 9/1980 | United Kingdom . |
| 2079962 | 1/1982 | United Kingdom . |
| 2119939 | 11/1983 | United Kingdom . |
| 2184854 | 7/1987 | United Kingdom . |

Primary Examiner—Donald A. Griffin
Attorney, Agent, or Firm—Kane, Dalsimer, Sullivan, Kurucz, Levy, Eisele & Richard

[57] ABSTRACT

Disclosed is an imaging device wherein a latent image is formed by projecting an optical image on a photo and pressure sensitive recording sheet, on which a plurality of microcapsules enveloping photo-hardenable resins and chromogenic materials therein are coated, and a visible image is developed on a transfer sheet by pressurizing the recording sheet in superposed state with the transfer sheet, the transfer sheet being coated with color-developing agents which react with the chromogenic materials to develop the visible image.

The disclosed imaging device comprises an exposing unit for exposing the recording sheet, which is arranged to extend over the entire width of the recording sheet, and a pressing unit for pressing the recording sheet and the transfer sheet in superposed state.

4 Claims, 3 Drawing Sheets

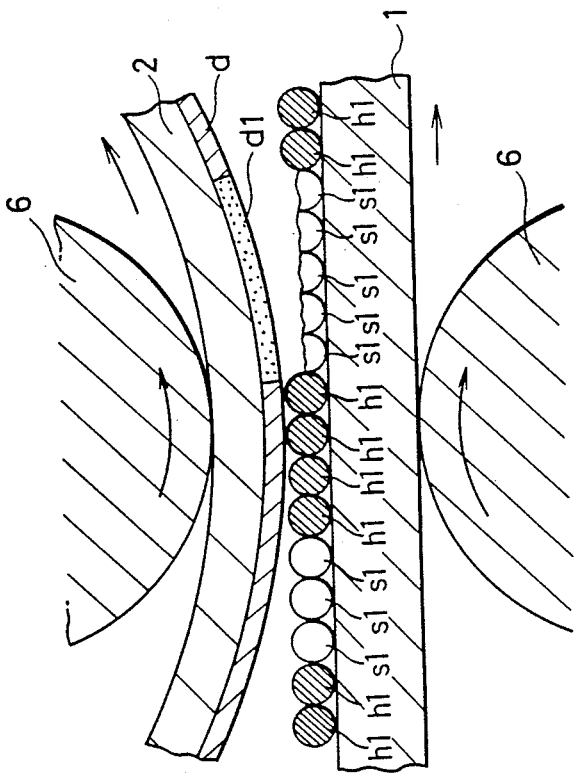

IMAGING DEVICE

BACKGROUND OF THE INVENTION

This invention relates to an imaging device adapting an optical printing system such as an optical printer and a photo-copy machine, and more particularly to an imaging device for developing an image on a transfer sheet by applying a pressure thereon under such condition as being superposed with a photo and pressure sensitive recording sheet on which a latent image is formed by exposing an optical image thereon.

Recently, such photo and pressure sensitive recording sheet has been proposed as being coated with photo-hardenable microcapsules containing chromogenic materials, and a visible image is developed on a separate transfer sheet coated with developing agents which react with the chromogenic materials for development. With such transfer type recording sheet, a latent image is first formed on the recording sheet by directly exposing it to a corresponding optical image and then the visible image is developed on the transfer sheet, with the result of a fine printing quality with the image of higher resolution and greater clearness than with the so far prevailing way of printing through transfer of a toner image onto a common paper.

Such transfer type recording sheet therefore tends to be used as printing paper for an optical printer and/or a photo-copy machine. For use with an optical printer, for instance, optical signals responsive to characters and/or picture informations output from a computer are first projected to the recording sheet to form a latent image thereon.

As the photo-hardenable microcapsules, microcapsules enveloping photo-hardenable resins therein has been used because it is versatile and easily available. With such microcapsules, when the pressure is applied thereto, the microcapsules which are not hardened yet as being not exposed to light are ruptured to allow chromogenic materials therein to stream out and react with the developing agents on the transfer sheet for development.

However, these has arisen a problem here that is, when the recording sheet is set to be as wide as the transfer sheet, the edge of the transfer sheet may not be developed if the sheets are widthwise offset from each other. It takes a higher cost to design the device such that the both sheets should exactly overlap each other with no edge sticking one out of the other. Fruthermore, in a design where the recording sheet is pinched at its both edges by pinch rollers which are rotated to feed the sheet in a certain direction before exposure, the microcapsules at these edges of the recording sheet may be ruptured by the pinch rollers so that it becomes impossible to use such edge portions of the recording sheet for forming a latent image thereon. Thus, the width of the recording sheet is set to be wider than that of the transfer sheet for the reasons mentioned above.

With the recording sheet wider than the transfer sheet as described above, when the recording sheet overlying the transfer sheet are inserted together between the pressing rollers, the unhardened microcapsules on the edge portions of the recording sheet sticking out of the transfer sheet are ruptured to cause the chromogenic materials and photo-hardenable resins to stream out and stick to the roller surfaces. The deposit is thickened on the roller surfaces with extended use of the optical printing device and finally causes a change in pressure applied by the pressing rollers, which results in incomplete rupturing of the unhardened microcapsules and therefore irregular development of the image on the transfer sheet. Also, the deposit on the pressing rollers sometimes soil the subsequent transfer sheet so that extra maintenance becomes required, for instance, for cleaning the pressing rollers more frequently.

SUMMARY OF THE INVENTION

It is therefore an object of this invention to provide an improved imaging device of the type as described above capable of, when the recording sheet on which a latent image is formed is coated with microcapsules enveloping photo-hardenable resins and chromogenic materials, preventing rupturing of the microcapsules on the marginal edges of the recording sheet sticking out of the transfer sheet when pressurized by a pressing unit and therefore depositing the streamed out chromogenic materials and photo-hardenable resins on the pressing unit.

For the above purpose, according to the present invention, there is provide an imaging device wherein a latent image is formed by projecting optical image on a photo and pressure sensitive recording sheet, on which a plurality of microcapsules enveloping photo-hardenable resins and chromogenic materials therein are coated, and a visible image is developed on a transfer sheet by presurizing said recording sheet in superposed state with said transfer sheet, said transfer sheet being coated with color-developing agents which react with said chromogenic materials to develop said visible image, which comprises: an exposing unit for exposing said recording sheet, said exposing unit being arranged to extend over the entire width of the recording sheet; and a pressing unit for pressing said recording sheet and said transfer sheet in superposed state.

With the above constructed imaging device, the marginal edges of the recording sheet sticking out of the transfer sheet are exposed by means of the exposing unit to cause the microcapsules on the marginal edges to be hardened. Consequently, there are no microcapsules on the marginal edges of the recording sheet sticking out of the transfer sheet to be ruptured by the subsequent developing process executed by the pressing unit. This eliminates any deposit of chromogenic materials and/or photo-curable resins on the surface of the pressing unit.

DESCRIPTION OF THE ACCOMPANYING DRAWINGS

FIG. 3 is an explanetory view showing a recording sheet and a transferring sheet is overlapped state to be pressurized by pressing rollers.

DESCRIPTION OF THE PREFERRED EMBODIMENTS

Figure 1:
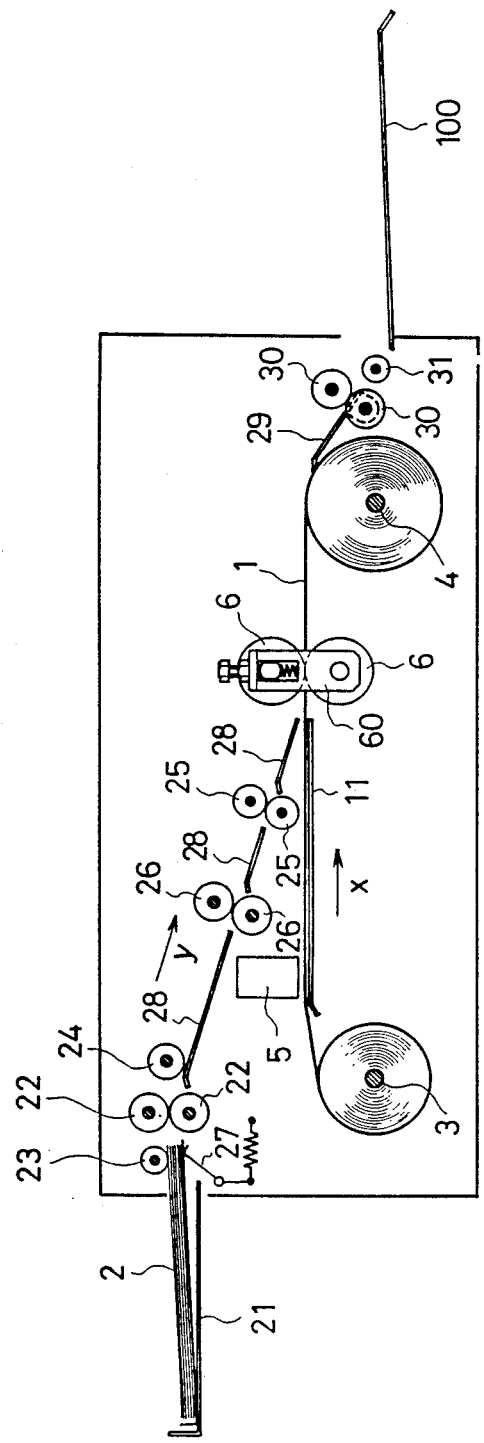
FIG. 1 shows a fundamental construction of an optical printer embodying the invention.
Figure 2:
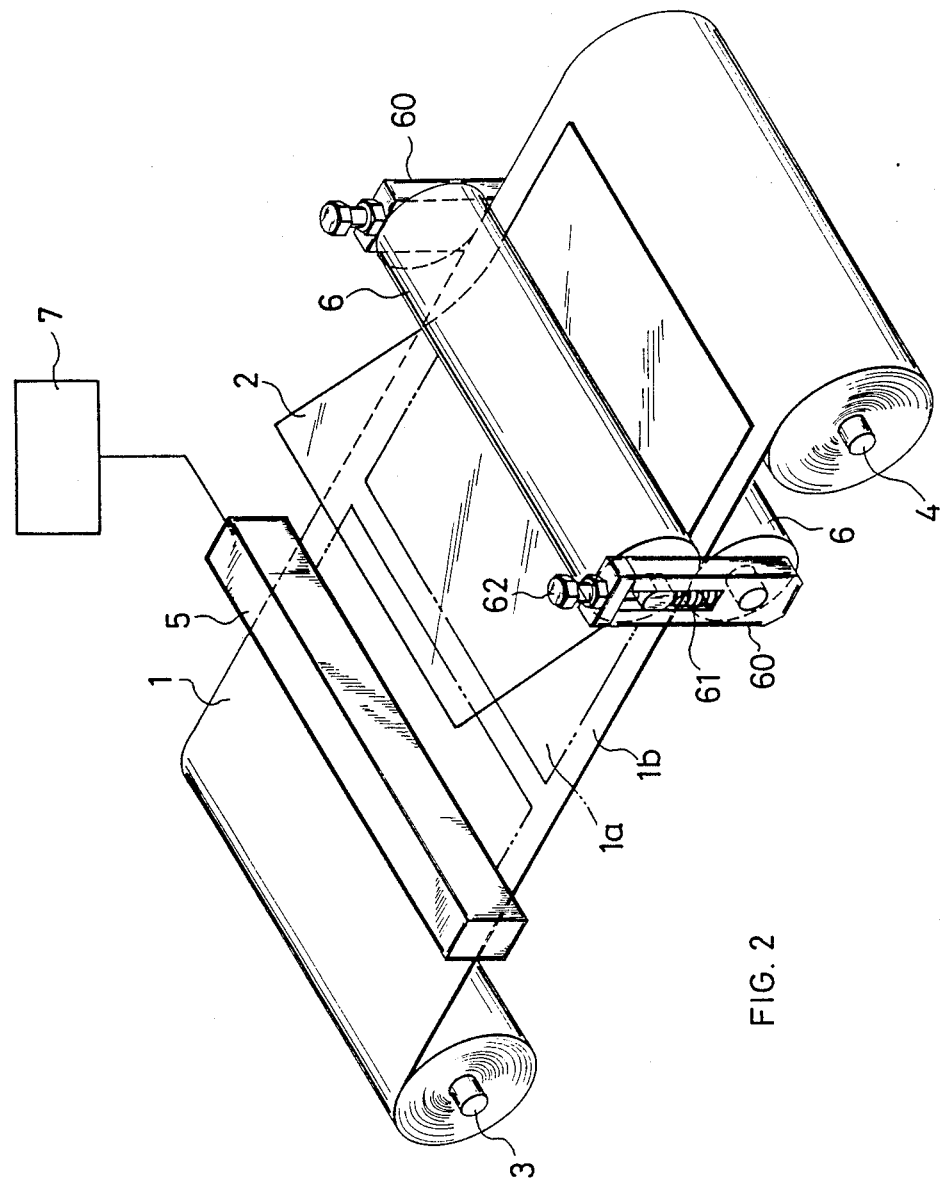
FIG. 2 is a perspective view showing essential parts of the optical printer shown in FIG. 1.

Illustrated in FIGS. 1 and 2 is an optical printer embodying the invention, wherein a latent image is formed on a roll formed serial recording paper 1 by a well-known light emitting diode (LED) array 5 and a visible image is then developed on a cut-sheet formed transfer paper 2. The transfer sheet 2 is cut to have some size of the image forming area 1a of the recording sheet 1.

The recording sheet 1 is set up to be fed from an uncoiler 3 to a recoiler 4 in the direction indicated by an arrow x in FIG. 1 along a guide plate 11. Provided on the travel path of the recording sheet 1 is the LED array 5 serving as an exposing unit for exposing the recording sheet 1 and a pair of pressing rollers 6, 6 which pressurize the recording sheet 1 and the transfer sheet 2 inserted therebetween in a superposed state. The LED array 5 is located closely above the path of the recording sheet 1 and extended over the entire width of the recording sheet 1. A control circuit 7 (see FIG. 2) connected with the LED array 5 receives electric signals representing characters and/or picture informations from a computer not shown, in response to which optical signals are applied onto the recording sheet 1 according to an electro-photographic system. The recording sheet 1 is thus exposed to form a latent image thereon in the same manner as in the prior art.

The pressing rollers 6, 6 are supported by a pair of side arms 60, 60, each of side arm 60 is provided with a spring 61 and a screw shaft 62 to adjust the position of the upper pressing roller 6 relative to the lower pressing roller 6 so as to vary the degree of the pressure applied therebetween.

The transfer sheets 2 are stocked on a sheet tray 21 and fed one by one in the direction indicated by an arrow Y in FIG. 1 by a feed roller 23 to a pair of pinch rollers 22 and then transferred to the pressing rollers 6, 6 as being guided by guide plates 28 via guide rollers 24, 25 and intermediate pinch rollers 26, 26. At the opposite side of the feed roller 23, provided is a spring biased plate 27 for biasing front sides of the stocked transfer sheets 2 against the feed roller 23.

At the discharge side of the recoiler 4, provided is a peeling plate 29 to separate the transfer sheet 1 from the recording sheet 2 and guide it to pinch rollers 30, 31 so as to discharge it toward a discharge tray 100.

With the imaging device as above constructed, optical signals are continuously projected on the recording sheet 1 at the time when the sheet 1 is passing under the LED array 5 to form a latent image on the area 1a of the sheet 1. Then, the recording sheet 1 is pressurized by the pair of pressing rollers 6, 6 as being overlapped with the transfer sheet 2 fed from the sheet tray 21 at a suitable timing taken by a computer, not shown, to develop a visible image on the transfer sheet 2.

More particularly, as illustrated in FIG. 3, the recording sheet 1 coated with microcapsules, some h1 of which are hardened by exposed to the optical signals while others s1 of which remain unhardened as being not exposed to light, is pressed by pressing rolelrs 6, 6 together with the transferring sheet 2, on which a layer of color-developing agents d is formed. With pressed by the pressing rollers 6, 6, the unhardened microcapsules s1 are ruptured and the chromogenic materials enveloped therein are streamed out of the microcapsules s1 and reacted with the color-developing agents d to form developed areas d1 on the surface of the transfer sheet 2. The hardened microcapsules h1 are not ruptured so that the corresponding area on the surface of the transfer sheet 2 remains white if the original color of the transfer sheet 2 is white, thus the visible image is formed thereon.

In the imaging device as above described, the LEDs arranged on either edge position of the LED array 5, which corresponds to each marginal edge 1b of the recording sheet 1 sticking out of the transfer sheet 2 are always controlled to be ON state. Thereby, the microcapsules on such marginal edges 1b of the recording sheet 1 sticking out of the transfer sheet 2 are always exposed to harden microcapsules coated on the area 1b. Then, when the recording sheet 1 and the transfer sheet 2 overlying each other are fed between the pressing rollers 6, 6, no microcapsule is therefore ruptured on the marginal area 1b of the recording sheet 1 sticking out of the transfer sheet 2. This eliminates any deposit of chromogenic materials and/or photo-hardenable resins onto the pressing rollers 6, 6.

Further, as there is a some time lag between the supply of the current transfer sheet 2 and a subsequent transfer sheet 2, the control circuit 7 may control the LED array 5 to keep it ON over entire width of the recording sheet 1 to expose it throughout its width.

With the above constructed imaging device, the marginal edge portion of the recording sheet can be exposed to harden the microcapsules coated on the corresponding area, and thereby, if the recording sheet is wider than the transfer sheet, or the recording sheet, which has same width as of the transfer sheet, is offset relative to the transfer sheet, the pressing unit is free from any soil or stain with chromogenic materials and/or photo-curable redsins. This ensures a virtually permanently stabilized image development and eliminates any soil of subsequent transfer sheets, while providing easier maintenance. Further, as there is no design requirement such as to provide expensive mechanism to eliminate any offset between the recording sheet and the transfer sheet, it can be offered to the market at a relatively lower price.

What is claimed is:

1. An imaging device wherein a latent image is formed by projecting an optical image on a photo and pressure sensitive recording sheet, on which a plurality of microcapsules enveloping photo-hardenable resins and chromogenic materials therein are coated, and a visible image is developed on a transfer sheet by pressurizing said recording sheet in superposed state with said transfer sheet, said transfer sheet being coated with color-developing agents which react with said chromogenic materials to develop said visible image, said recording sheet including a predetermined central area and a remaining area, which comprises:
   a first optical means for projecting said optical image onto said predetermined central area of said recording sheet;
   a second optical means for projecting light onto said remaining area so that substantially all microcapsules existing on said remaining area are hardened; and
   a pressing unit for pressing said recording sheet and said transfer sheet in superposed state,
   whereby, both edge portions of said recording sheet are always exposed by said second optical means irrespective of an image to be recorded.

2. The imaging device according to claim 1 wherein said pressing unit comprises a pair of pressing rollers.

3. The imaging device according to claim 1 wherein said recording sheet is formed to be a rolled serial sheet while said transfer sheet is formed to a cut sheet.

4. An imaging device wherein a latent image is formed by projecting optical image on a photo and pressure sensitive recording sheet, on which a plurality of microcapsules enveloping photo-hardenable resins and chromogenic materials therein are coated, and visible image is developed on a transfer sheet by pressurizing said recording sheet in superposed state with said transfer sheet, said transfer sheet being coated with color-developing agents which react with said chromogenic materials to develop said visible image, which comprises:
- a light emitting diode array for exposing said recording sheet, said diode array being arranged to extend over and entire width of the recording sheet; and
- a pressing unit for pressing said recording sheet and said transfer in superposed state, wherein certain portions of said light emitting diode array corresponding to both edge portions of said recording sheet are always controlled to be in an ON state irrespective of variation of an image to be recorded.

* * * * *